US009246630B2

(12) United States Patent
Dui (10) Patent No.: US 9,246,630 B2
(45) Date of Patent: Jan. 26, 2016

(54) METHOD, DEVICE, AND SYSTEM FOR FORWARD ERROR CORRECTION

(75) Inventor: Jiying Dui, Nanjing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 937 days.

(21) Appl. No.: 13/455,549

(22) Filed: Apr. 25, 2012

(65) Prior Publication Data

US 2012/0210195 A1 Aug. 16, 2012

Related U.S. Application Data

(63) Continuation of application No. PCT/CN2011/070793, filed on Jan. 30, 2011.

(30) Foreign Application Priority Data

Jan. 30, 2010 (CN) .......................... 2010 1 0109517

(51) Int. Cl.
*H03M 13/00* (2006.01)
*H04L 1/00* (2006.01)
(Continued)

(52) U.S. Cl.
CPC ......... *H04L 1/0041* (2013.01); *H03M 13/3761* (2013.01); *H04L 1/007* (2013.01); *H04L 1/0009* (2013.01); *H04L 1/0017* (2013.01);
(Continued)

(58) Field of Classification Search
CPC ............... H03M 13/05; H03M 13/11; H03M 13/13–13/19; H03M 13/35; G06F 11/08; G06F 11/085; G06F 11/10; G06F 11/1004; G06F 11/10046

USPC ........... 714/752, 774, 776, 779; 365/240–241
See application file for complete search history.

(56) References Cited

U.S. PATENT DOCUMENTS 7,739,580 B1 * 6/2010 Fang et al. ..................... 714/776
2006/0146703 A1 * 7/2006 Cha et al. ...................... 370/229
(Continued)

FOREIGN PATENT DOCUMENTS

CN 1741435 A 3/2006
CN 1909436 A 2/2007
(Continued)

OTHER PUBLICATIONS

Huahui Wu, Mark Claypool, and Robert Kinicki; "Adjusting Forward Error Correction with Temporal Scaling for TCP-Friendly Streaming MPEG", Nov. 2005, ACM Transaction on Multimedia Computing, Communications and Applications, vol. 1, pp. 315-337.*
(Continued)

*Primary Examiner* — Albert Decady
*Assistant Examiner* — Christian Dorman
(74) *Attorney, Agent, or Firm* — Conley Rose, P.C.; Grant Rodolph; Adam J. Stegge (57) ABSTRACT

A method for forward error correction (FEC) includes obtaining information on a type of a current frame, where the current frame includes a key frame and a non-key frame; determining a coding redundancy of the current frame according to the type of the current frame and a redundancy coding strategy, where the coding redundancy of the key frame is greater than that of the non-key frame; and using the determined coding redundancy to generate an FEC code for the current frame. The method is applicable to circumstances where FEC is performed for media data of various coding formats.

14 Claims, 4 Drawing Sheets

(51) Int. Cl.
*H03M 13/37* (2006.01)
*G06F 11/08* (2006.01)
*H03M 13/35* (2006.01)
*H03M 13/05* (2006.01)

(52) U.S. Cl.
CPC .............. *G06F11/085* (2013.01); *H03M 13/05* (2013.01); *H03M 13/35* (2013.01); *H03M 13/356* (2013.01)

(56) References Cited

U.S. PATENT DOCUMENTS

| | | | |
|---|---|---|---|
| 2007/0101228 A1* | 5/2007 | Vesma et al. | 714/752 |
| 2008/0040648 A1 | 2/2008 | Li | |
| 2008/0052605 A1 | 2/2008 | Luo et al. | |
| 2008/0137725 A1* | 6/2008 | Chou et al. | 375/240.01 |
| 2009/0254657 A1* | 10/2009 | Melnyk et al. | 709/224 |
| 2009/0327842 A1* | 12/2009 | Liu et al. | 714/776 |
| 2011/0099449 A1 | 4/2011 | Li | |

FOREIGN PATENT DOCUMENTS

| | | |
|---|---|---|
| CN | 101072083 A | 11/2007 |
| CN | 101854224 A | 10/2010 |
| EP | 2058968 A1 | 5/2009 |
| WO | WO 2009/059955 A1 | 5/2009 |

OTHER PUBLICATIONS

Foreign Communication From a Counterpart Application, PCT Application PCT/CN2011/070793, English Translation of Written Opinion dated May 5, 2011, 6 pages.

First Chinese Office Action (Partial Translation), dated (mailed) Apr. 27, 2012, issued in related Chinese Patent Application No. 201010109517.6 (Chinese version attached) (12 pgs.).

English-language translation of International Search Report from the Chinese Patent Office in International Application No. PCT/CN2011/070793 mailed May 5, 2011.

* cited by examiner

METHOD, DEVICE, AND SYSTEM FOR FORWARD ERROR CORRECTION

CROSS-REFERENCE TO RELATED APPLICATIONS

This application is a continuation of International Application No. PCT/CN2011/070793, filed on Jan. 30, 2011, which claims priority to Chinese Patent Application No. 201010109517.6, filed on Jan. 30, 2010, both of which are hereby incorporated by reference in their entireties.

FIELD OF THE INVENTION

The present invention relates to technologies for processing streaming media data, and in particular, to a method, a device, and a system for forward error correction.

When real-time streaming media data is transmitted through a network, packet loss may result in a mosaic, a pause, and other phenomena at the time of playing, affecting the playing effect. The packet loss problem may be solved through data retransmission, but the data retransmission may make the media data unable to reach a terminal in time, causing a delay in playing, so that the real-time demand of the users for multimedia services is not satisfied. The forward error correction (Forward Error Correction, FEC) technology is widely applied in the industry because it can well solve the packet loss problem in the real-time data transmission.

When a media server sends media data packets to a terminal, the media server generates redundant FEC data for these media data packets according to a uniform redundancy by using the FEC technology, and sends both the media data packets and the FEC data to the terminal. After the terminal receives the data, if the terminal finds that a media data packet is lost, the lost media data packet is restored using the media data packets and the FEC data that are received, so that the packet loss can be reduced and that the playing effect can be improved in the implementation of real-time transmission. The more FEC data the media server generates, the more likely the terminal restores the media data, and the better the playing quality is, but the higher transmission bandwidth the FEC data occupies. The less FEC data the media server generates, the less likely the terminal restores the media data and the worse the playing quality is, but the lower transmission bandwidth the FEC data occupies.

In network transmission, in order to reduce transmission bandwidth, the streaming media data, such as a video picture, is compressed into media data packets and then FEC is performed before the media data is transmitted on the network. Generally, the following three compression methods are used: The first method is to compress the current picture directly, where the compressed picture is referred to as an I frame; the second method is to calculate a difference between the current picture and the previous picture based on the previous picture, and when storing or sending the current picture, only to store or send the difference, where such a picture is referred to as a P frame. The third method is to calculate a difference between the current picture and the previous picture and a difference between the current picture and the next picture based on the previous picture and the next picture, and when storing or sending the current picture, only to store or send these differences, where such a picture is referred to as a B frame.

For I frame data, after receiving the I frame data, the terminal may directly restore the current picture for playing; for P frame data, after receiving the P frame data, the terminal needs to refer to the previous picture to restore the current picture for playing; and for B frame data, after receiving the B frame data, the terminal needs to rely on the previous picture and the next picture to restore the current picture for playing.

The prior art performs FEC for all types of frames of media data packets according to a uniform redundancy. Consequently, since the loss or error of the I frame data will greatly affect the restoration of the P frame data and the B frame data, the transmission bandwidth cannot be effectively utilized, and the ability to restore the lost packets is very limited, and therefore the playing effect is poor.

SUMMARY OF THE INVENTION

Embodiments of the present invention provide a method, a device, and a system for FEC, which are used for effectively utilizing the transmission bandwidth, significantly enhancing the ability of a receiving end to restore the data of the lost packets, and improving the playing effect when implementing FEC, and the implementation method is simple and has high feasibility.

To achieve the foregoing objective, the embodiments of the present invention adopt the following technical solutions:

A method for forward error correction includes:

obtaining information on a type of a current frame, where the frame includes a key frame and a non-key frame;

determining a coding redundancy of the current frame according to the type of the current frame and a redundancy coding strategy, where the coding redundancy of the key frame is greater than that of the non-key frame; and using the determined coding redundancy to generate an FEC code for the current frame.

A method for forward error correction includes:

when a media data packet of a current frame is lost, obtaining a coding redundancy corresponding to the lost media data packet, where the frame includes a key frame and a non-key frame, and the coding redundancy of the key frame is greater than that of the non-key frame; and using the coding redundancy to restore the lost media data packet.

An apparatus for forward error correction includes:

a frame type identifying unit, configured to identify a type of a current frame, where the frame includes a key frame and a non-key frame;

a determining unit, configured to determine a coding redundancy of the current frame according to the type of the current frame known by the frame type identifying unit and a redundancy coding strategy, where the coding redundancy of the key frame is greater than that of the non-key frame; and a coding unit, configured to use the coding redundancy determined by the determining unit to generate an FEC code for the current frame.

A terminal device includes:

an obtaining unit, configured to obtain, when a media data packet of a current frame is lost, a coding redundancy corresponding to the lost media data packet, where the frame includes a key frame and a non-key frame, and the coding redundancy of the key frame is greater than that of the non-key frame; and a data packet restoring unit, configured to use the coding redundancy obtained by the obtaining unit to restore the lost media data packet.

A communication system includes the apparatus for forward error correction and/or the terminal device.

A communication system includes a streaming media server and a terminal, where:

the streaming media server includes:

a streaming media parsing unit, configured to parse an obtained media stream to obtain media data and send the media data to a streaming media transmission coding unit in units of frames, where the frame includes a key frame and a non-key frame;

a redundancy coding strategy unit, configured to set and store a redundancy coding strategy to provide a corresponding coding redundancy to the streaming media transmission coding unit, where the coding redundancy of the key frame is greater than that of the non-key redundancy;

the streaming media transmission coding unit, configured to query the redundancy coding strategy unit according to a type of each frame of media data from the streaming media parsing unit to know the coding redundancy of the current frame, and divide and packetize the media data into media data packets and send the media data packets to an FEC coding unit; and the FEC coding unit, configured to generate, according to the coding redundancy of the current frame, an FEC code for the received media data packets, and send the coding redundancy, the FEC code, and the media data packets to the terminal through a network;

the terminal includes:

an FEC decoding unit, configured to receive data from the streaming media server, and when a media data packet of the current frame is lost, obtain the coding redundancy corresponding to the lost media data packet, use the coding redundancy to decode and restore the lost media data packet, and send the media data packet to a media playing unit; and the media playing unit, configured to extract media data from the media data packets from the FEC decoding unit and play the extracted media data.

According to the technical solutions of the embodiments of the present invention, when performing FEC, the sending end uses different coding redundancies for different types of frames of media data packets, where the coding redundancy for the key frames of higher importance is greater than the coding redundancy for the non-key frames of lower importance, and the receiving end restores, according to different coding redundancies, the media data packets lost in transmission, so that the problem caused by performing the FEC for all types of frames of media data packets according to a uniform redundancy in the prior art is solved. When implementing FEC, the technical solutions of the embodiments of the present invention can effectively utilize the transmission bandwidth, significantly enhance the ability of the receiving end to restore the data of the lost packets, and improve the playing effect, and the implementation method is simple and has high feasibility.

BRIEF DESCRIPTION OF THE DRAWINGS

To make the technical solutions of the embodiments of the present invention or the prior art clearer, the accompanying drawings used in the description of the embodiments or the prior art are briefly described in the following. Evidently, the accompanying drawings illustrate only some exemplary embodiments of the present invention and persons skilled in the art can obtain other drawings based on these drawings without creative efforts.

DETAILED DESCRIPTION OF THE EMBODIMENTS

The technical solutions of the embodiments of the present invention are described clearly and completely with reference to the accompanying drawings in the embodiments of the present invention in the following. It is evident that the described embodiments are only some exemplary embodiments of the present invention, rather than all embodiments of the present invention. All other embodiments that persons skilled in the art obtain without creative efforts based on the embodiments of the present invention also fall within the protection scope of the present invention.

Figure 1:
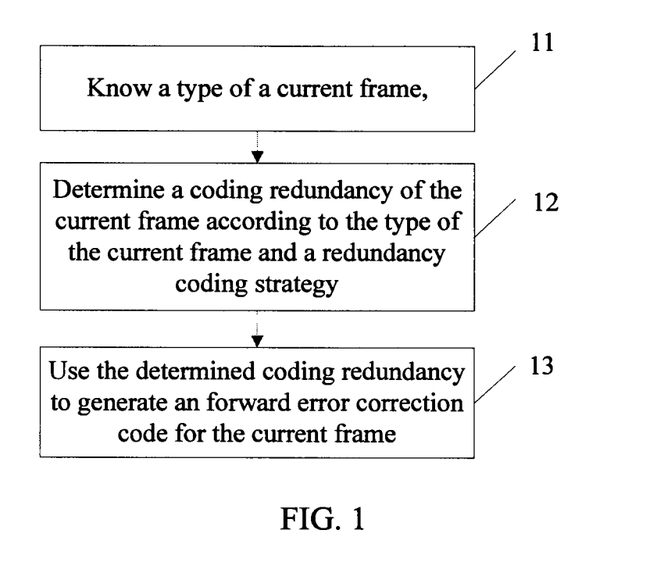
FIG. 1 is a flowchart of a method for FEC according to a first embodiment of the present invention.

The first embodiment of the present invention provides a method for FEC. As shown in FIG. 1, the method includes:

Step 11: Obtain information on a type of a current frame, where the frame includes a key frame and a non-key frame.

Step 12: Determine a coding redundancy of the current frame according to the type of the current frame and a redundancy coding strategy, where the coding redundancy of the key frame is greater than that of the non-key frame.

Step 13: Use the determined coding redundancy to generate an FEC code for the current frame.

According to the technical solution of the embodiment of the present invention, when performing FEC, a sending end, such as a media server, uses different coding redundancies for different types of frames of media data packets, that is, the coding redundancy for the key frames of higher importance, such as I frames, is greater than the coding redundancy for the non-key frames of lower importance, such as P frames and B frames. The coding redundancy may be represented as (m, k), that is, k FEC data packets are generated for m media data packets.

The first embodiment of the present invention further provides a method for a media server to generate FEC data packets for the current frame, which is described in detail in the following. The current frame is comprised of multiple media data packets, and one coding set of media data packet is used as a unit to perform FEC, where the coding set of media data packets includes m media data packets.

Firstly, when implementing FEC, the media server performs redundancy coding by taking m consecutive media data packets as one coding set of media data packets. For example, when m is 2, for the consecutive media data packets AppData1 and AppData2 to be checked, FEC redundancy coding is performed by taking the 2 media data packets as 1 coding set of media data packets.

The media server then generates FEC data for the coding set of data packets through a certain FEC algorithm according to the determined coding redundancy, for example, the coding redundancy is (2, 1), that is, a 1-byte FEC data packet is generated for every 2 media data packets. Specifically, when the lengths of the media data packets in the coding set of media data packets are different, firstly, the remaining media data packets are padded according to the length of the longest media data packet in the coding set of media data packets, for example, for the coding set of media data packets including AppData1 and AppData2, when the length of AppData1 is smaller than that of AppData2, AppData1 is padded so that after the padding, the AppData1 has the same length as AppData2, and an XOR operation is performed for the padded AppData1 and AppData2 to obtain the FEC data, that is, FECData1.

Secondly, the media server packetizes the FEC data, where a packet header indicates which media data packets correspond to the FEC data packet, for example, the header of the FEC data packet is filled with an identifier (ID) of the coding set of media data packets including AppData1 and AppData2, and after the FEC data FECData1 and the ID of the media data packets are packetized into the FEC data packet, the media data packets and the FEC data packet are sent to the terminal.

A receiving end, such as a terminal, restores, according to different coding redundancies, the media data packets lost in transmission.

Further, the redundancy coding strategy includes:

using a uniform coding redundancy to perform redundancy coding on the key frame, without performing redundancy coding on the non-key frame; or when the transmission bandwidth remains unchanged, increasing the coding redundancy of the key frame, and decreasing the coding redundancy of the non-key frame; or when the transmission bandwidth is decreased, maintaining the current coding redundancy of the key frame, and decreasing the coding redundancy of the non-key frame, for example, when the transmission bandwidth A at the time t is smaller than the transmission bandwidth B at the time t−1, that is, the transmission bandwidth is decreased, maintaining, at the time t, the coding redundancy of a key frame at the time t−1, and using a coding redundancy smaller than the coding redundancy at the time t−1 for encoding a non-key frame at the time t; or when the transmission bandwidth is increased, increasing the coding redundancy of the key frame, and maintaining the current coding redundancy of the non-key frame; or when a first non-key frame precedes a second non-key frame at the decoding end in a decoding sequence, increasing the coding redundancy of the first non-key frame, and decreasing the coding redundancy of the second non-key frame.

Figure 6:
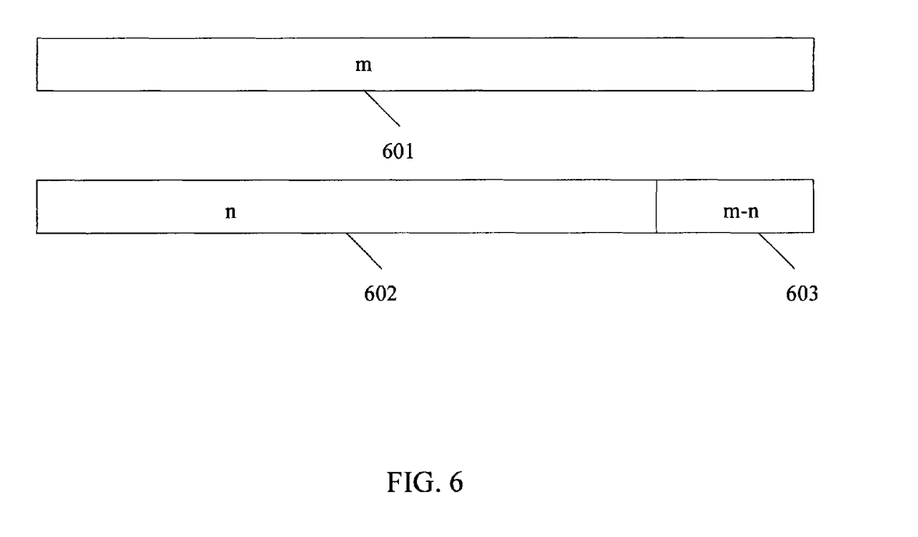
FIG. 6 illustrates a frame having media data packets and default media data packets according to an exemplary embodiment.

Further, when the current frame is comprised of an integral multiple of coding sets of media data packets and n remaining media data packets, m−n default media data packets are generated, and an FEC data packet is generated for the coding set of media data packets including default media data packets and n remaining media data packets. For example, and with reference to FIG. 6, a first coding set of a frame may comprise m media data packets 601. However, a second coding set of the frame may comprise only n media data packets 602 and then have m−n default media data packets 603 added to the frame so that there are now m media data packets.

To make the technical solution of this embodiment of the present invention clearer, another example is described in detail in the following.

If the current frame is an I frame and includes 50×1024 bytes, and each media data packet can carry 188 bytes of valid data in transmission, the current I frame is divided into 273 media data packets, where the last media data packet (only 64 bytes) is not enough to have 188 bytes, and therefore the last media data packet is padded, for example, the remaining 124 bytes in the last media data packet are padded with 0s.

It is determined that in the coding redundancy (m, n), m is 2 and n is 1, and therefore every 2 media data packets of the 273 media data packets form 1 coding set of media data packets, where the last coding set of media data packets has only one media data packet, which is smaller than the value 2 of m. Therefore, an additional default media data packet needs to be generated for the last coding set of media data packets, for example, a default media data packet made up of 0s is generated. For each coding set of media data packets, 1 redundancy check data packet is generated, and in total, 137 FEC data packets are generated. All of the 273 media data packets and 137 FEC data packets are sent to the terminal.

This embodiment of the present invention uses different coding redundancies to generate the FEC codes in units of frames, so that when implementing FEC, this embodiment can effectively utilize the transmission bandwidth, significantly enhance the ability of the receiving end to restore the data of the lost packets, and improve the playing effect, and this embodiment is simple to implement, has a low calculation burden and is suitable for a media server with very large throughput, and has high feasibility.

Figure 2:
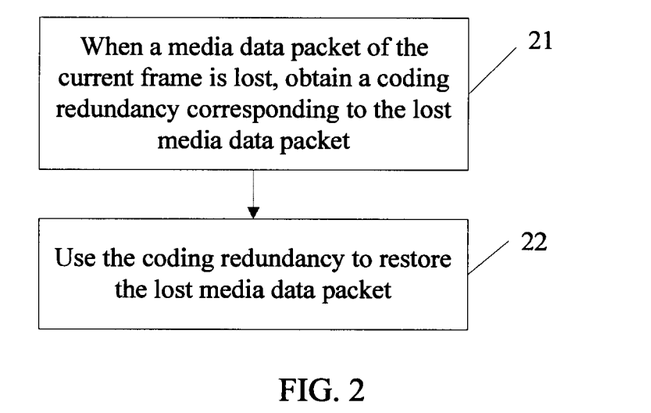
FIG. 2 is a flowchart of a method for FEC according to a second embodiment of the present invention.

The second embodiment of the present invention provides a method for forward error correction. As shown in FIG. 2, the method includes:

Step 21: When a media data packet of the current frame is lost, obtain a coding redundancy corresponding to the lost media data packet, where the frame includes a key frame and a non-key frame, and the coding redundancy of the key frame is greater than that of the non-key frame.

Step 22: Use the coding redundancy to restore the lost media data packet.

After a receiving end, such as a terminal, receives the media data packets and the FEC data packets, if the terminal finds that a media data packet is lost, the terminal restores the lost media data packet by using the already received media data packets and the FEC data packets.

When the total number of the media data packets belonging to the same coding set of media data packets and the FEC data packets corresponding to the media data packets received by the terminal is m, the terminal starts to restore the lost media data packet by using the received media data packets and the FEC data packets, where the coding redundancy is represented as (m, k), the coding set of media data packets includes m media data packets, and the FEC data packets include a packet header and an FEC code, where the packet header includes an ID of the coding set of media data packets and the coding redundancy.

For example, the coding redundancy is represented as (2, 1), and when the terminal receives the media data packet AppData1 belonging to the same coding set of media data packets and the FEC data packet including FEC data FECData1, it is found that AppData2 is lost; therefore, AppData1 is padded according to the length of FECData1, and then an XOR operation is performed for the padded AppData1 and FECData1 to restore AppData2.

Further, when the number of media data packets that are received by the terminal and belong to the same coding set of media data packets is n and n is smaller than m, m−n default media data packets are to be generated, and the received media data packets belonging to the same coding set of media data packets, FEC data packets corresponding to the received media data packets, and the generated default media data packets are used to restore the lost media data packet.

Figure 3:
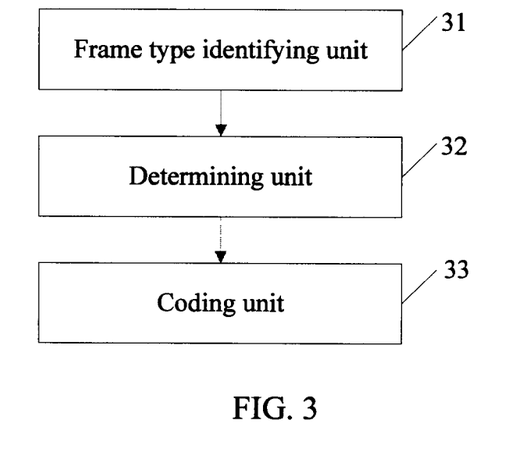
FIG. 3 is a schematic structural diagram of an apparatus for FEC according to a third embodiment of the present invention.

This embodiment of the present invention uses different coding redundancies to generate the FEC codes in units of frames, so that when implementing FEC, this embodiment can effectively utilize the transmission bandwidth, significantly enhance the ability of the receiving end to restore the data of the lost packets, and improve the playing effect, and this embodiment is simple to implement, has a low calculation burden and is suitable for a media server with very large throughput, and has high feasibility The third embodiment of the present invention provides an apparatus for forward error correction. As shown in FIG. 3, the apparatus includes:

a frame type identifying unit 31, configured to know a type of a current frame, where the frame includes a key frame and a non-key frame; a determining unit 32, configured to determine the coding redundancy of the current frame according to the type of the current frame known by the frame type identifying unit 31 and a coding redundancy strategy, where the coding redundancy of the key frame is greater than that of the non-key frame; and a coding unit 33, configured to use the coding redundancy determined by the determining unit 32 to generate an FEC code for the current frame.

Further, the determining unit 32 determines the coding redundancy of the current frame according to the type of the current frame and at least one of the following redundancy coding strategies:

using a uniform coding redundancy to perform redundancy coding on the key frame, without performing redundancy coding on the non-key frame; or when the transmission bandwidth remains unchanged, increasing the coding redundancy of the key frame, and decreasing the coding redundancy of the non-key frame; or when the transmission bandwidth is decreased, maintaining the current coding redundancy of the key frame, and decreasing the coding redundancy of the non-key frame; or when the transmission bandwidth is increased, increasing the coding redundancy of the key frame, and maintaining the current coding redundancy of the non-key frame; or when a first non-key frame precedes a second non-key frame at the decoding end in a decoding sequence, increasing the coding redundancy of the first non-key frame, and decreasing the coding redundancy of the second non-key frame.

For the specific operation mode of the functional modules and units in this apparatus embodiment of the present invention, refer to the method embodiment of the present invention. The functional modules and units in this apparatus embodiment of the present invention may be implemented separately or integrated into one or more units.

This embodiment of the present invention uses different coding redundancies to generate the FEC codes in units of frames, so that when implementing FEC, this embodiment can effectively utilize the transmission bandwidth, significantly enhance the ability of the receiving end to restore the data of the lost packets, and improve the playing effect, and this embodiment is simple to implement, has a low calculation burden and is suitable for a media server with very large throughput, and has high feasibility.

Figure 4:
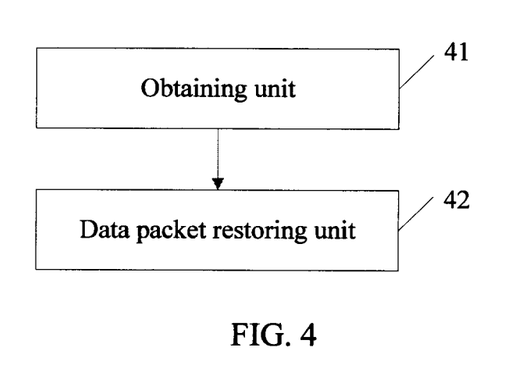
FIG. 4 is a schematic structural diagram of a terminal device according to a fourth embodiment of the present invention.

The fourth embodiment of the present invention provides a terminal device. As shown in FIG. 4, the terminal device includes:

an obtaining unit 41, configured to obtain a coding redundancy corresponding to the lost media data packet when a media data packet of a current frame is lost, where the frame includes a key frame and a non-key frame, and the coding redundancy of the key frame is greater than that of the non-key frame; and a data packet restoring unit 42, configured to use the coding redundancy obtained by the obtaining unit 41 to restore the lost media data packet.

Further, the data packet restoring unit 42 is configured to restore, when total the number of the received media data packets belonging to the same coding set of media data packets and the FEC data packets corresponding to the received media data packets is m, the lost media data packet is restored by using the received media data packets and the FEC data packets, where the coding redundancy is represented as (m, k), the coding set of media data packets includes m media data packets, and the FEC data packets include a packet header and an FEC code, where the packet header includes an ID of the coding set of media data packets and the coding redundancy.

For the specific operation mode of the functional modules and units in this apparatus embodiment of the present invention, refer to the method embodiment of the present invention. The functional modules and units in this apparatus embodiment of the present invention may be implemented separately or integrated into one or more units.

This embodiment of the present invention uses different coding redundancies to generate the FEC codes in units of frames, so that when implementing FEC, this embodiment can effectively utilize the transmission bandwidth, significantly enhance the ability of the receiving end to restore the data of the lost packets, and improve the playing effect, and this embodiment is simple to implement, has a low calculation burden and is suitable for a media server with very large throughput, and has high feasibility.

The fifth embodiment of the present invention provides a communication system, including the apparatus for forward error correction and/or the terminal device. Refer to the third embodiment of the present invention for the specific operation mode of the apparatus for forward error correction, and refer to the fourth embodiment of the present invention for the specific operation mode of the terminal device.

As described above, in the communication system of this embodiment of the present invention, when performing FEC, the sending end uses different coding redundancies for different types of frames of media data packets, where the coding redundancy for the key frames of higher importance is greater than the coding redundancy for the non-key frames of lower importance, and the receiving end restores, according to different coding redundancies, the media data packets lost in transmission, so that the problem caused by performing the FEC for all types of frames of media data packets according to a uniform redundancy in the prior art is solved. When implementing FEC, the technical solution of this embodiment of the present invention can effectively utilize the transmission bandwidth, significantly enhance the ability of the receiving end to restore the data of the lost packets, and improve the playing effect, and the implementation method is simple and has high feasibility.

Figure 5:
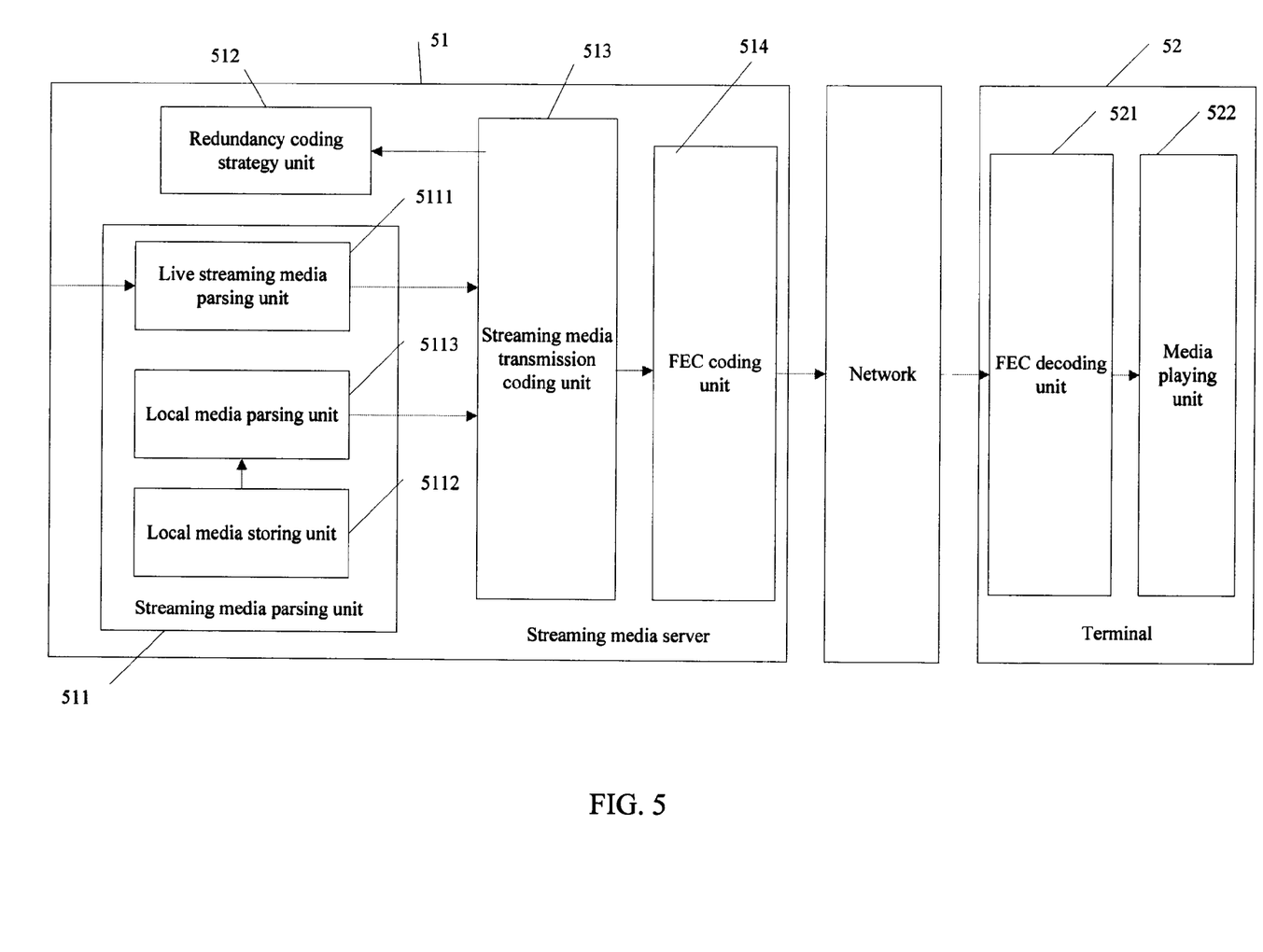
FIG. 5 is a schematic structural diagram of a communication system according to a sixth embodiment of the present invention.

The communication system according to the sixth embodiment of the present invention includes a streaming media server 51 and a terminal 52, as shown in FIG. 5.

The streaming media server 51 includes:

a streaming media parsing unit 511, configured to parse an obtained media stream to obtain media data and send the media data to a streaming media transmission coding unit in units of frames, where the frame includes a key frame and a non-key frame;

a redundancy coding strategy unit 512, configured to set and store a redundancy coding strategy to provide a corresponding coding redundancy to the streaming media transmission coding unit, where the coding redundancy of the key frame is greater than that of the non-key redundancy;

the streaming media transmission coding unit 513, configured to query the redundancy coding strategy unit 512 according to the type of each frame of media data from the streaming media parsing unit 511 to know the coding redundancy of the current frame, and divide and packetize the media data into media data packets and send the media data packets to an FEC coding unit 514; and the FEC coding unit 514, configured to generate, according to the coding redundancy of the current frame, an FEC code for the received media data packets, and send the coding redundancy, the FEC code, and the media data packets to the terminal 52 through the network.

The terminal 52 includes:

an FEC decoding unit 521, configured to receive data from the streaming media server, and when a media data packet of the current frame is lost, obtain the coding redundancy corresponding to the lost media data packet, use the coding redundancy to decode and restore the lost media data packet, and send the media data packet to a media playing unit 522; and the media playing unit 522, configured to extract the media data from the media data packets from the FEC decoding unit 521 and play the extracted media data.

According to different types of services that require FEC, when processing a live service, the streaming media parsing unit 511 includes: a live streaming media parsing unit 5111, configured to receive and parse live media data and send the live media data to the streaming media transmission coding unit in units of frames; and/or, when processing an on-demand service, the streaming media parsing unit 511 includes: a local media storing unit 5112, configured to store local media data; and a local media parsing unit 5113, configured to read media data stored in the local media storing unit and send the media data to the streaming media transmission coding unit in units of frames.

Further, in order to ensure successful transmission of data between the streaming media server 51 and the terminal 52 through the network, the streaming media server 51 may also include a server signaling processing unit (not shown in FIGs), and the terminal 52 may also include a terminal signaling processing unit (not shown in FIGs).

The communication system according to the sixth embodiment of the present invention is described in detail in the following. Referring to FIG. 5 and using a scenario where the sending end is the media server and the receiving end is the terminal in the system as an example in the sixth embodiment of the present invention, a method for forward error correction is described in detail for different service types each, but the method is not limited to this scenario or this executor.

I. Live (Multicast) Service

When the media server 51 sends live content by means of multicast, the following process is included:

1. The live streaming media parsing unit 5111 obtains a live media stream from an external source server, parses the live media stream to obtain media data, and sends the obtained media data to the streaming media transmission coding unit 513 in units of frames so that the media data is packetized for transmission.

2. The streaming media transmission coding unit 513 packetizes the media data for transmission in units of frames, including the following processing:

(a) The streaming media transmission coding unit 513 determines the coding redundancy of the current frame.

The streaming media transmission coding unit 513 knows the coding redundancy of the current frame by querying the redundancy coding strategy unit 512 and according to the type of each frame of media data from the streaming media parsing unit 511.

The live streaming media parsing unit 5111 may know the type of the current frame of media data by performing parsing, and then notify the streaming media transmission coding unit 513, or the streaming media transmission coding unit 513 may directly parse the media data to know the type of the current frame, where the type of the current frame mainly includes a key frame, such as an I frame, and a non-key frame, such as a B frame or a P frame.

In the redundancy coding strategy unit 512, redundancy coding strategies for different types of frames are set and stored, and the redundancy coding strategy unit 512 determines the coding redundancy of the current frame according to a redundancy coding strategy.

The redundancy coding strategy may include:

if the transmission bandwidth remains unchanged, using different coding redundancies for different types of frames; increasing the coding redundancy of I frames, and decreasing the coding redundancies of the B frames and the P frames, which means that the coding redundancy of the I frames is greater than that of the B frames and that of the P frames, for example, the coding redundancy of the I frame data is that 10 FEC data packets are generated for every 100 media data packets, the coding redundancy of the P frame data is that 5 FEC data packets are generated for every 100 media data packets, and the redundancy of the B frame data is that 1 FEC data packet is generated for every 100 media data packets.

Alternatively, the redundancy coding strategy may also include: if the redundancy remains unchanged, that is, the same coding redundancy is used, but the coding redundancy is used only to perform FEC redundancy coding on the I frames, without performing FEC redundancy coding on the P frames and the B frames, decreasing the required transmission bandwidth.

Alternatively, the redundancy coding strategy may also include: when a first non-key frame precedes a second non-key frame at the decoding end in a decoding sequence, increasing the coding redundancy of the first non-key frame, and decreasing the coding redundancy of the second non-key frame. This means that, in a playing unit, the media server 51 determines the redundancy of the FEC data according to the decoding sequence of the media data in the terminal, that is, the higher the decoding sequence ranks, the higher the redundancy is, and the lower the decoding sequence ranks, the lower the redundancy is.

Alternatively, the redundancy coding strategy may also include: when the transmission bandwidth is decreased, maintaining the current coding redundancy of the key frames and decreasing the coding redundancy of the non-key frames; for example, if the transmission bandwidth is decreased, the media server 51 maintains the coding redundancy of the I frame data unchanged and decreases the coding redundancies of the B frame data and the P frame data.

Alternatively, the redundancy coding strategy may also include: when the transmission bandwidth is increased, increasing the coding redundancy of the key frames and maintaining the current coding redundancy of the non-key frames; for example, if the transmission bandwidth is increased, the media server 51 maintains the coding redundancies of the B frame data and the P frame data unchanged and increases the coding redundancy of the I frame data.

(b) For each frame, the streaming media transmission coding unit 513 notifies the FEC coding unit 514 of starting a new round of redundancy coding on media data packets, and informs the FEC coding unit that the coding redundancy of the current frame is (m, k).

(c) The streaming media transmission coding unit 513 divides and packetizes, according to the transmission protocol (such as RTP, TS and TS over RTP), the media data into media data packets suitable for transmission, and submits the media data packets to the FEC coding unit 514 for redundancy coding.

3. The FEC coding unit 514 performs FEC redundancy coding on media data packets.

The FEC coding unit 514 performs FEC coding for the media data packets by coding sets of media data packets, and when the coding redundancy is represented as (m, k), m media data packets form one coding set of media data packets.

The FEC coding unit 514 receives and buffers the media data packets from the streaming media transmission coding unit 513, and when m media data packets are buffered, the following processing is performed:

(i) The calculated length of the maximum media data packet in the m buffered media data packets is MaxLength.

(ii) Patch data is padded to the buffered media data packets (for example, data whose content is 0 is padded), so that the length of each of all media data packets is MaxLength.

(iii) A redundancy coding algorithm is used to generate k FEC data packets for the m media data packets, where a length of each of the k FEC data packets is MaxLength. The FEC data packets include a packet header and FEC data.

Here, the specific coding method for generating FEC data is not limited. For example, Vandermonde codes, Cauchy codes, Loss Resilient codes, and Tornado codes may be used.

(iv) The FEC data is packetized to generate FEC data packets. The header of each FEC data packet indicates an ID of the media data packets corresponding to the FEC data packet (that is, the corresponding coding set of media data packets) and the coding redundancy used in the coding, but is not limited thereto, and the header may also carry other necessary information. Subsequently, the media data packets and the FEC data packets are sent to the terminal simultaneously.

When the current frame includes an integral multiple of coding sets of media data packets and n remaining media data packets, where n is smaller than m, that is, when FEC data packets are generated for the current frame in units of coding sets of media data packets, the number of the remaining media data packets (n) is smaller than m, the FEC coding unit 514 generates m−n default media data packets, for example, m−n media data packets whose lengths are all MaxLength and whose content is all 0s are generated. The m−n default media data packets and the remaining n media data packets form one coding set of media data packets, and an FEC data packet is generated for this coding set of media data packets. At this time, the header of this FEC data packet may carry an ID indicating that this coding set of media data packets has default media data packets and n remaining media data packets.

(v) The current buffer is cleared.

4. After the processing of the current frame data is completed, the streaming media transmission coding unit notifies the FEC coding unit 514 of terminating this round of redundancy coding on media data packets.

The FEC coding unit 514 sends the media data packets and the FEC data packets to each terminal by means of multicast through the network.

After receiving the multicast media data, the terminal 52 performs the following process:

The FEC decoding unit 521 of the terminal 52 determines the redundancy coding algorithm used for the received media data packets, for example, the FEC decoding unit 521 may determine the redundancy coding algorithm through the description information of the live content, therefore ensuring that the sending end and the receiving end use the same redundancy coding algorithm.

After receiving the media data packets and the FEC data packets from the network, the FEC decoding unit 521 of the terminal firstly judges whether a media data packet is lost. If no media data packet is lost, the FEC data packet is directly discarded; and when a media data packet of the current frame is lost, the terminal 52 performs the following processing:

(a) The FEC decoding unit 521 finds the FEC data packet corresponding to the lost media data packet.

When a different redundancy coding algorithm is used, the FEC data packets corresponding to the lost media data packet may also be different. For example, the FEC data packets corresponding to the data packets may be all or several of the FEC data packets generated according to the coding set of media data packets to which the lost media data packet belongs.

(b) The FEC decoding unit 521 parses the headers of the FEC data packets to obtain the relevant parameters m and k of the coding redundancy.

(c) The FEC decoding unit 521 parses the headers of the FEC data packets, and fords the received media data packets according to the Ds of the media data packets indicated in the headers If the number (assumed to be n) of the relevant media data packets indicated in the headers is smaller than m, m−n default media data packets are generated;

(d) If the total number of the FEC data packets, the media data packets, and the default media data packets (if necessary) that are received by the FEC decoding unit 521 is m, a decoding algorithm corresponding to the redundancy coding algorithm is used to restore the lost media data packets.

(e) The restored media data packets are submitted to the media playing unit 522 for playing.

The media playing unit 522 receives the media data packets from the FEC decoding unit 521, extracts the media data from the media data packets, and plays the media data.

II. Live (Unicast) Service

When the terminal requests the streaming media server to play live content, the following processing is included:

Firstly, the terminal 52 and the media server 51 perform an information interaction to ensure that the used redundancy coding algorithms are the same. For example, the terminal 52 requests description information of the live content from the media server 51 through the terminal signaling processing unit; the media server 51 returns the description information of the live content through the server signaling processing unit, where the description information of the live content includes information indicating the redundancy coding algorithm; then, the terminal signaling processing unit sets the coding algorithm used by the FEC decoding unit 521 of the terminal, and sends a play request to the server signaling processing unit of the media server 51. The server signaling processing unit notifies the live streaming media parsing unit 5111 of obtaining the live media stream from the external source server. In the subsequent procedure, refer to steps 1 to 4 in the foregoing Live (Multicast) Service for the specific operation mode of the media server 51 and refer to steps (a) to (e) in the foregoing Live (Multicast) Service for the specific operation mode of the terminal 52.

III. On-Demand Service

When the terminal requests the streaming media server to play on-demand content, the following processing is included:

Firstly, the terminal 52 and the media server 51 perform an information interaction to ensure that the used redundancy coding algorithms are the same. For example, the terminal 52 requests description information of the on-demand content from the media server 51 through the terminal signaling processing unit; the media server 51 returns the description information of the on-demand content through the server signaling processing unit, where the description information of the on-demand content includes information indicating the redundancy coding algorithm; then, the terminal signaling processing unit sets the coding algorithm used by the FEC decoding unit 521 of the terminal, and sends a play request to the server signaling processing unit of the media server 51.

The server signaling processing unit then notifies the local media parsing unit 5113 of reading local media data from the local media storing unit 5112, and the local media parsing unit 5113 parses the local media file to obtain media data and sends the obtained media data to the streaming media transmission coding unit 513 in units of frames so that the media data is packetized for transmission. In the subsequent procedure, refer to steps 1 to 4 in the foregoing Live (Multicast) Service for the specific operation mode of the media server 51 and refer to steps (a) to (e) in the foregoing Live (Multicast) Service for the specific operation mode of the terminal 52.

According to the technical solutions of the embodiments of the present invention, when performing FEC, the sending end uses different coding redundancies for different types of frames of media data packets, where the coding redundancy for the key frames of higher importance is greater than the coding redundancy for the non-key frames of lower importance, and the receiving end restores, according to different coding redundancies, the media data packets lost in transmission, so that the problem caused by performing the FEC for all types of frames of media data packets according to a uniform redundancy in the prior art is solved. When implementing FEC, the technical solutions of the embodiments of the present invention can effectively utilize the transmission bandwidth, significantly enhance the ability of the receiving end to restore the data of the lost packets, and improve the playing effect, and the implementation method is simple and has high feasibility.

Those skilled in the art may clearly understand that the present invention may be implemented by software and a necessary general hardware platform. Based on such understanding, the technical solutions of the present invention or the portions contributing to the prior art may be embodied in the form of a software product. The computer software product may be stored in a storage medium, such as a ROM/RAM, a magnetic disk, or a CD-ROM, and include several instructions to cause a computer device (which may be a personal computer, a server, a network device, and so on) to execute the method described in the embodiments or some parts of the embodiments of the present invention.

Detailed above are only exemplary embodiments of the present invention, but the protection scope of the present invention is not limited thereto. Any modification or substitution easily conceivable by those skilled in the art within the scope of the technology disclosed herein shall be covered within the protection scope of the present invention. Therefore, the protection scope of the present invention is subject to the appended claims.

What is claimed is:

1. A method for forward error correction (FEC), comprising:
   obtaining information on a type of a current frame, wherein the current frame comprises a key frame and a non-key frame, wherein the current frame comprises a plurality of media data packets, and wherein a coding set of the current frame comprises m media data packets;
   determining a coding redundancy of the current frame according to the type of the current frame and a redundancy coding strategy, wherein the coding redundancy is represented as (m, k), and wherein the coding redundancy of the key frame is greater than that of the non-key frame;
   increasing the coding redundancy of a first non-key frame when a decoding sequence of the first non-key frame is set to precede a second non-key frame at a decoding end;
   decreasing the coding redundancy of the second non-key frame when the decoding sequence of the first non-key frame is set to precede the second non-key frame at the decoding end; and
   generating, by applying the coding redundancy, an FEC code for the current frame, wherein generating the FEC code comprises generating k FEC data packets for each coding set of the plurality of media data packets,
   wherein the FEC data packets comprise a packet header and the FEC code, and
   wherein the packet header comprises the coding redundancy and an identifier (ID) of the coding set.

2. The method for FEC according to claim 1, wherein the redundancy coding strategy comprises using a uniform coding redundancy to perform redundancy coding on the key frame without performing redundancy coding on the non-key frame.

3. The method for FEC according to claim 1, wherein when the current frame comprises an integral multiple of coding sets of media data packets and n remaining media data packets, the method further comprises:
   generating m−n default media data packets; and
   generating FEC data packets for a coding set of media data packets comprising the default media data packets and the n remaining media data packets, wherein n is smaller than m.

4. The method for FEC according to claim 3, wherein the key frame comprises an I frame and the non-key frame comprises a P frame and a B frame.

5. A method for forward error correction (FEC), comprising:
   obtaining, in response to a media data packet of a current frame being lost, a coding redundancy corresponding to the lost media data packet, wherein the current frame comprises a key frame and a non-key frame, and the coding redundancy of the key frame is greater than that of the non-key frame, wherein the coding redundancy of a first non-key frame is increased and the coding redundancy of a second non-key frame is decreased when a decoding sequence of the first non-key frame is set to precede the second non-key frame at a decoding end; and
   restoring, using the coding redundancy, the lost media data packet,
   wherein the restoring the lost media data packet comprises restoring the lost media data packet by using received media data packets and FEC data packets when a total number of the received media data packets belonging to a same coding set of media data packets and the FEC data packets corresponding to the received media data packets is m,
   wherein the coding redundancy is represented as (m, k) and the coding set of media data packets comprises m media data packets,
   wherein the FEC data packets comprise a packet header and an FEC code, and
   wherein the packet header comprises an identifier (ID) of the coding set of media data packets and the coding redundancy.

6. The method for FEC according to claim 5, wherein when the number of the media data packets belonging to the same coding set of media data packets is n and n is smaller than m, using the coding redundancy to restore the lost media data packet comprises:
  generating m−n default media data packets; and
  using the received media data packets belonging to the same coding set of media data packets, FEC data packets corresponding to the received media data packets, and the generated m−n default media data packets to restore the lost media data packet.

7. An apparatus for forward error correction (FEC), comprising:
  a frame type identifying unit configured to identify a type of a current frame, wherein the current frame comprises a key frame and a non-key frame;
  a determining unit configured to:
    determine a coding redundancy of the current frame according to the type of the current frame identified by the frame type identifying unit and a redundancy coding strategy, wherein the coding redundancy of the key frame is greater than that of the non-key frame;
    increase the coding redundancy of a first non-key frame when a decoding sequence of the first non-key frame is set to precede a second non-key frame at a decoding end; and
    decrease the coding redundancy of the second non-key frame when the decoding sequence of the first non-key frame is set to precede the second non-key frame at the decoding end; and
  a coding unit configured to:
    generate, using the coding redundancy determined by the determining unit, an FEC code for the current frame; and
    generate FEC data packets comprising the FEC code and a packet header, wherein the packet header comprises an identifier (ID) of the coding set of media data packets and the coding redundancy.

8. The apparatus for FEC according to claim 7, wherein the determining unit determines the coding redundancy of the current frame according to the type of the current frame and at least one of the following redundancy coding strategies:
  using a uniform coding redundancy to perform redundancy coding on the key frame, without performing redundancy coding on the non-key frame; or
  when transmission bandwidth remains unchanged, increasing the coding redundancy of the key frame, and decreasing the coding redundancy of the non-key frame; or
  when transmission bandwidth is decreased, maintaining the current coding redundancy of the key frame, and decreasing the coding redundancy of the non-key frame; or
  when transmission bandwidth is increased, increasing the coding redundancy of the key frame, and maintaining the current coding redundancy of the non-key frame.

9. A terminal device, comprising:
  an obtaining unit configured to obtain, when a media data packet of a current frame is lost, a coding redundancy corresponding to the lost media data packet, wherein the current frame comprises a key frame and a non-key frame, and the coding redundancy of the key frame is greater than that of the non-key frame, wherein the coding redundancy of a first non-key frame is increased and the coding redundancy of a second non-key frame is decreased when a decoding sequence of the first non-key frame is set to precede the second non-key frame at a decoding end; and
  a data packet restoring unit configured to:
    use the coding redundancy obtained by the obtaining unit to restore the lost media data packet; and
    restore, when the total number of received media data packets belonging to a same coding set of media data packets and forward error correction (FEC) data packets corresponding to the received media data packets is m, the lost media data packet using the received media data packets and the FEC data packets,
  wherein the coding redundancy is represented as (m, k) and the coding set of media data packets comprises m media data packets,
  wherein the FEC data packets comprise a packet header and an FEC code, and
  wherein the packet header comprises an identifier (ID) of the coding set of media data packets and the coding redundancy.

10. A communication system, comprising:
  a terminal; and
  a streaming media server comprising:
    a streaming media transmission coding unit;
    a forward error correction (FEC) coding unit;
    a streaming media parsing unit configured to parse an obtained media stream to obtain media data and send the media data to the streaming media transmission coding unit in units of frames, wherein the frames comprise key frames and non-key frames; and
    a redundancy coding strategy unit configured to set and store a redundancy coding strategy to provide a corresponding coding redundancy to the streaming media transmission coding unit, wherein the coding redundancy of the key frames is greater than that of the non-key frames, wherein the coding redundancy of a first non-key frame is increased and the coding redundancy of a second non-key frame is decreased when a decoding sequence of the first non-key frame is set to precede the second non-key frame at a decoding end,
    wherein the streaming media transmission coding unit is configured to:
      query the redundancy coding strategy unit according to a type of each frame of media data from the streaming media parsing unit to know the coding redundancy of a current frame; and
      divide and packetize the media data into media data packets and send the media data packets to the FEC coding unit, and
    wherein the FEC coding unit is configured to:
      generate, according to the coding redundancy of the current frame, an FEC code for the received media data packets;
      generate FEC data packets comprising the FEC code and a packet header, wherein the packet header comprises an identifier (ID) of the coding set of media data packets and the coding redundancy; and
      send the media data packets and the FEC data packets to the terminal through a network,
  wherein the terminal comprises:
    a media playing unit; and
    an FEC decoding unit configured to:
      receive data from the streaming media server;
      obtain the coding redundancy corresponding to the lost media data packet when a media data packet of the current frame is lost;
      use the coding redundancy to decode and restore the lost media data packet; and send the media data packet to a media playing unit, and wherein the media playing unit is configured to extract media data from the media data packets from the FEC decoding unit and play the extracted media data.

11. The communication system according to claim 10, wherein the streaming media parsing unit comprises:

a live streaming media parsing unit configured to:

receive a live media stream and parse the live media stream to obtain live media data, and send the live media data to the streaming media transmission coding unit in units of frames.

12. The communication system according to claim 10, wherein the streaming media parsing unit comprises:

a local media storing unit configured to store local media files; and a local media parsing unit configured to:

read the media files in the local media storing unit and parse the media files to obtain local media data, and send the local media data to the streaming media transmission coding unit in units of frames.

13. The method for FEC according to claim 1, wherein, when transmission bandwidth remains unchanged, the redundancy coding strategy comprises increasing the coding redundancy of the key frame and decreasing the coding redundancy of the non-key frame.

14. The method for FEC according to claim 1, wherein, when transmission bandwidth is decreased, the redundancy coding strategy comprises maintaining the current coding redundancy of the key frame and decreasing the coding redundancy of the non-key frame.

* * * * *